United States Patent
Hiralal

(10) Patent No.: US 9,934,913 B2
(45) Date of Patent: Apr. 3, 2018

(54) APPARATUS AND ASSOCIATED METHODS

(75) Inventor: Pritesh Hiralal, Las Palmas (ES)

(73) Assignee: Nokia Technologies Oy, Espoo (FI)

( * ) Notice: Subject to any disclaimer, the term of this patent is extended or adjusted under 35 U.S.C. 154(b) by 1626 days.

(21) Appl. No.: 13/590,793

(22) Filed: Aug. 21, 2012

(65) Prior Publication Data

US 2013/0107486 A1 May 2, 2013

Related U.S. Application Data

(63) Continuation-in-part of application No. 13/281,919, filed on Oct. 26, 2011, now abandoned.

(51) Int. Cl.
| | |
|---|---|
| *H01M 2/00* | (2006.01) |
| *H01G 11/84* | (2013.01) |
| *H01G 11/14* | (2013.01) |
| *H05K 1/16* | (2006.01) |
| *H01G 11/08* | (2013.01) |
| *H05K 1/14* | (2006.01) |

(Continued)

(52) U.S. Cl.
CPC ............ *H01G 11/84* (2013.01); *H01G 11/08* (2013.01); *H01G 11/14* (2013.01); *H05K 1/162* (2013.01); *H01M 10/04* (2013.01); *H05K 1/145* (2013.01); *H05K 3/0097* (2013.01); *H05K 3/361* (2013.01); *H05K 3/368* (2013.01); *H05K 3/4697* (2013.01); *H05K 2201/09909* (2013.01); *H05K 2201/10037* (2013.01); *H05K 2203/1147* (2013.01); *Y02E 60/13* (2013.01); *Y10T 29/49126* (2015.01)

(58) Field of Classification Search
CPC ...................................................... H01M 2/00
See application file for complete search history.

(56) References Cited

U.S. PATENT DOCUMENTS

| | | | |
|---|---|---|---|
| 6,462,266 B1 | 10/2002 | Kurth ............................. | 136/251 |
| 6,468,692 B1 | 10/2002 | Nemoto et al. ............... | 429/174 |

(Continued)

FOREIGN PATENT DOCUMENTS

| | | |
|---|---|---|
| CN | 101292391 A | 10/2008 |
| CN | 101512828 A | 8/2009 |

(Continued)

OTHER PUBLICATIONS

English Translation of EP 2219261.*

*Primary Examiner* — Ula C Ruddock
*Assistant Examiner* — Frank Chernow
(74) *Attorney, Agent, or Firm* — Harrington & Smith

(57) ABSTRACT

An apparatus comprising:
  first and second circuit boards with respective electrodes thereon, the first and second circuit boards in a bonded configuration;
  one or more first layers positioned to be proximal to the one or more of the electrodes;
  electrolyte proximal to the respective electrodes;
  one or more second layers configured to provide for the bonded configuration in which the first and second circuit boards are bonded together, under curing, such that the respective one or more first layers are positioned between the one or more second layers and the electrodes, the bonding defining a chamber therebetween with the electrodes therein and facing one another, the chamber comprising the electrolyte; and
  wherein the one or more first layers are configured to inhibit interaction of the electrolyte with the one or more second layers during curing.

14 Claims, 10 Drawing Sheets

(51) Int. Cl.
  *H05K 3/36* (2006.01)
  *H01M 10/04* (2006.01)
  *H05K 3/00* (2006.01)
  *H05K 3/46* (2006.01)

(56) References Cited

U.S. PATENT DOCUMENTS

| | | | |
|---|---|---|---|
| 7,901,817 B2 | 3/2011 | Markoski et al. | 429/414 |
| 2005/0200447 A1* | 9/2005 | Chandler | H01C 1/1406 338/25 |
| 2009/0129040 A1 | 5/2009 | Hsu | 361/783 |
| 2011/0051320 A1 | 3/2011 | Miller et al. | |

FOREIGN PATENT DOCUMENTS

| | | |
|---|---|---|
| EP | 1 339 127 A1 | 8/2003 |
| EP | 2219261 A1 | 8/2010 |
| EP | 2 369 603 A2 | 9/2011 |
| WO | WO 2012/042286 | 4/2012 |

\* cited by examiner

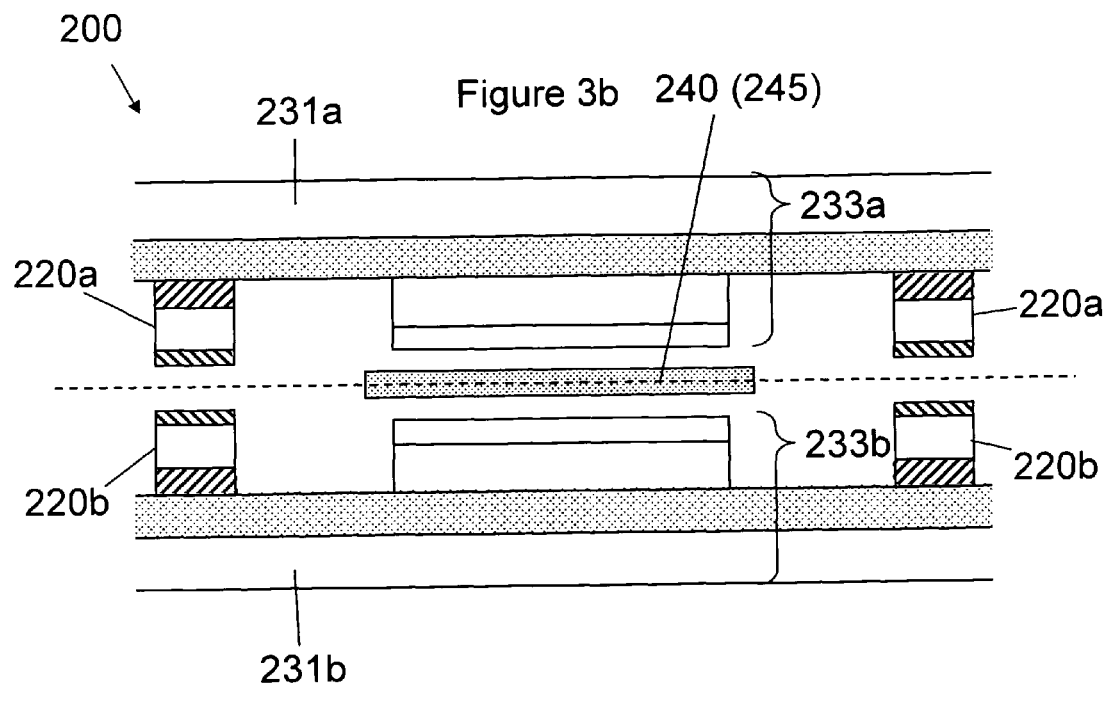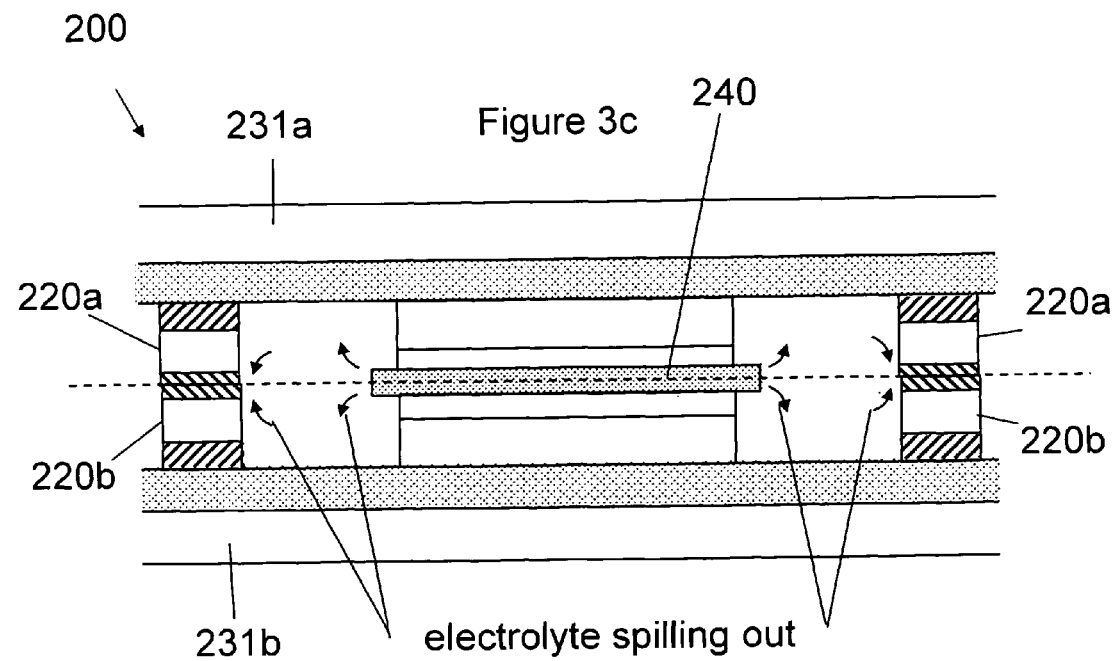

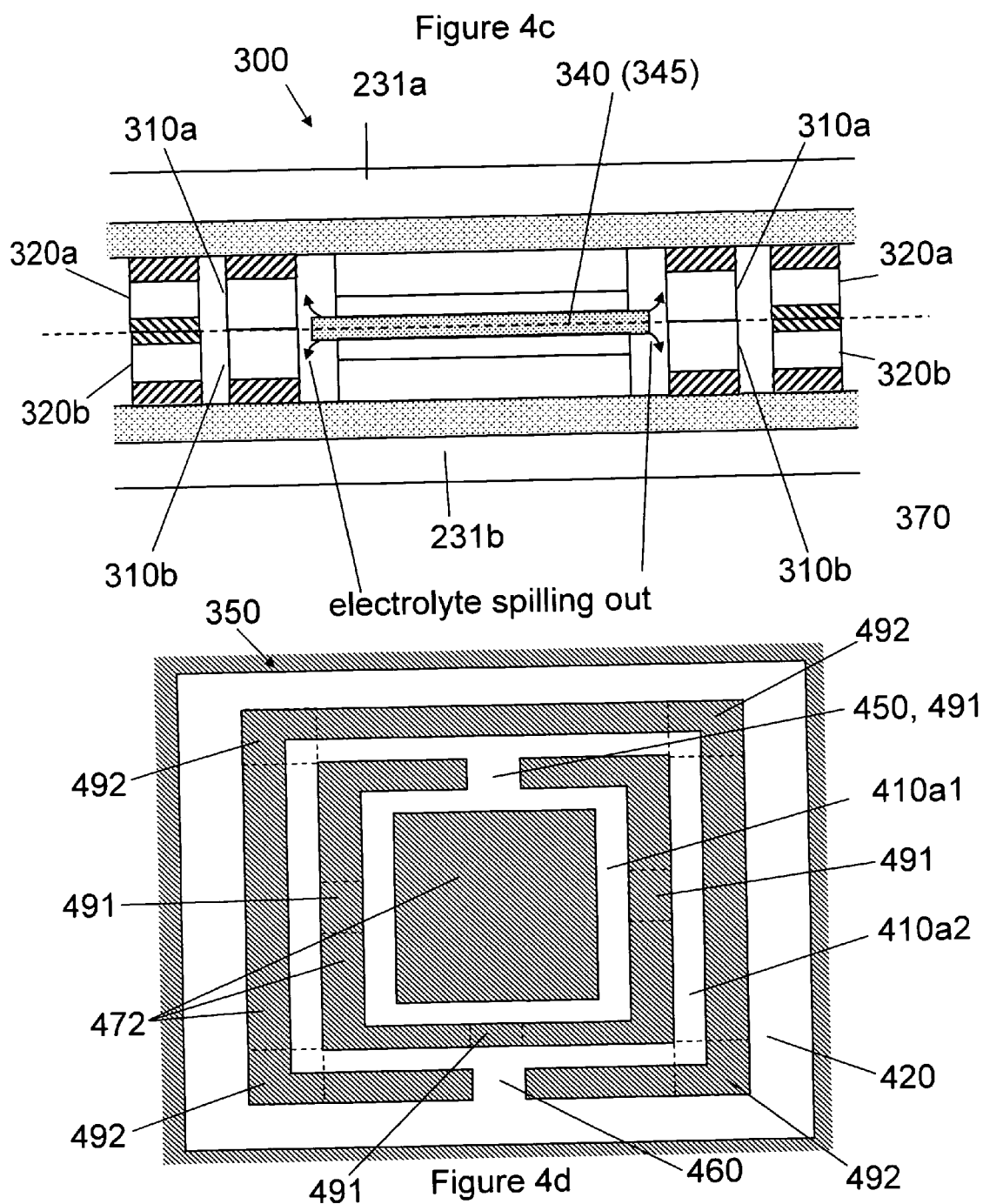

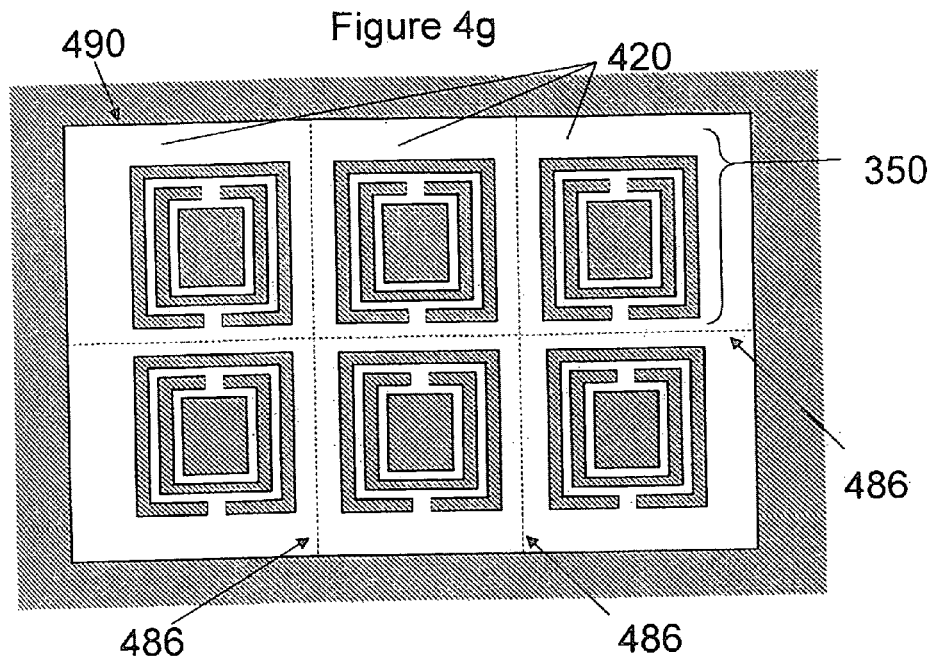

| 401 - providing first and second circuit boards with respective capacitive elements thereon; |

| 402 - providing one or more first layers positioned to be proximal to the one or more of the capacitive elements and configured/positioned to inhibit the interaction of the electrolyte with the one or more second layers during curing; |

| 403 - providing electrolyte proximal to the respective capacitive elements |

| 404 - bonding the first and second circuit boards together to provide a bonded configuration, under curing, using one or more second layers such that the respective one or more first layers are positioned between the one or more second layers and the capacitive elements, the bonding defining a chamber therebetween with the capacitive elements therein and facing one another (the chamber comprising the aforementioned electrolyte) |

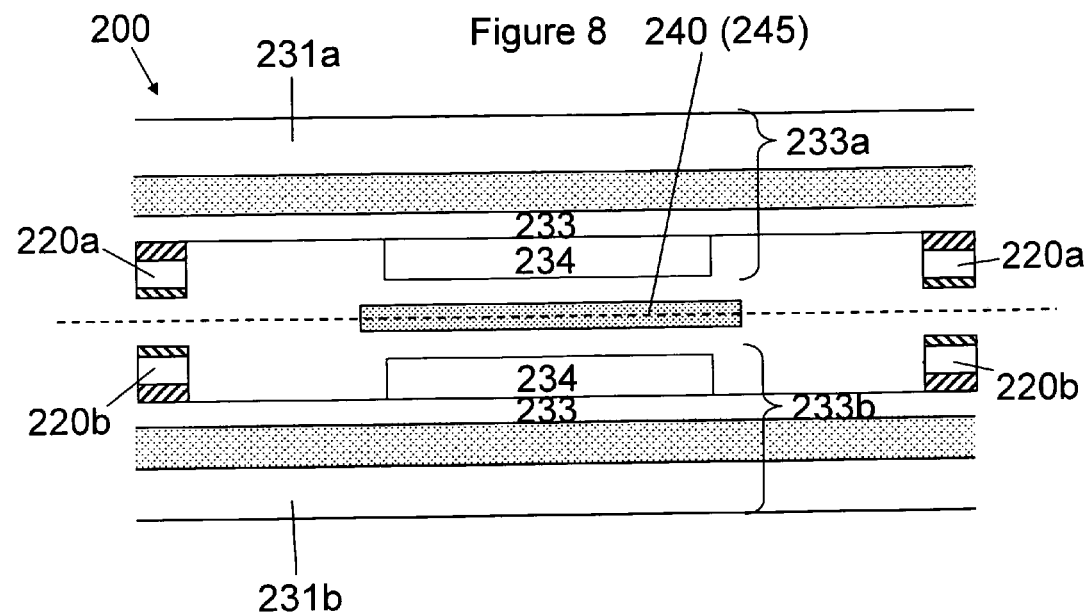
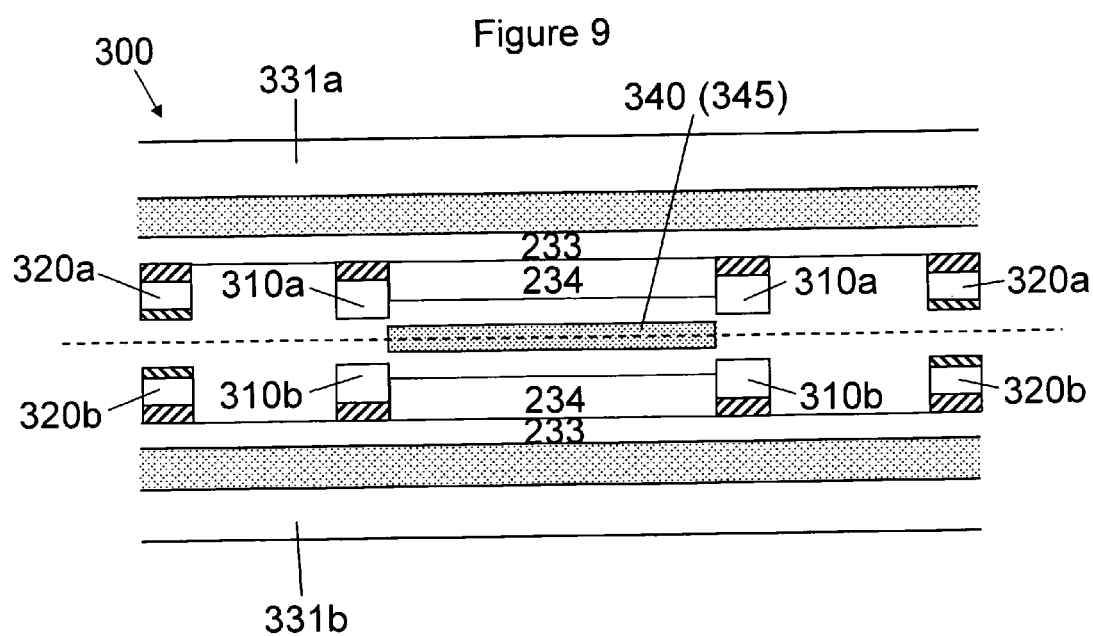

APPARATUS AND ASSOCIATED METHODS

CROSS-REFERENCE TO RELATED APPLICATION

This patent application is a continuation-in-part of U.S. patent application Ser. No. 13/281,919, filed Oct. 26, 2011 now abandoned which is hereby incorporated by reference in its entirety.

TECHNICAL FIELD

The present disclosure relates to the field of electrical storage cells and the like, associated apparatus, methods and computer programs, and in particular concerns the integration of an electrical storage cell within a flexible printed circuit (FPC) structure. Certain disclosed aspects/embodiments relate to electronic devices both portable and non-portable, in particular, so-called hand-portable electronic devices which may be hand-held in use (although they may be placed in a cradle in use). Such hand-portable electronic devices include so-called Personal Digital Assistants (PDAs).

The portable electronic devices/apparatus according to one or more disclosed aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Multimedia enhancement modules in portable electronic devices (such as camera flash modules, loudspeaker driver modules, and power amplifier modules for electromagnetic transmission) require short power bursts. Typically, electrolytic capacitors are used to power LED and xenon flash modules and conventional capacitors are used to power loudspeaker driver modules, but neither is able to satisfy the power demands needed for optimal performance. For example, xenon-based flashes typically use electrolytic capacitors due to their high voltage operation. In contrast, LED flashes take the required current straight from the battery rather than a capacitor. The use of a supercapacitor increases the maximum current that can be delivered to either flash type, thereby increasing their respective brightnesses.

The situation could be improved by the use of supercapacitors. In an LED flash module, for example, double the light output can be achieved using supercapacitors instead of electrolytic capacitors. The problem is not as straight forward as simply switching one type of capacitor for the other, however. In modern electronic devices, miniaturisation is an important factor, and state-of-the-art supercapacitors do not fulfil the size and performance requirements in currently available packaging. Power sources for modules requiring high power bursts have to be implemented close to the load circuit, which for flash and speaker applications means closer than 10-30 mm. Unfortunately, present supercapacitors are bulky, suffer from electrolyte swelling, and have the wrong form factor for attachment to the circuit boards of portable electronic devices. In addition, the attachment of supercapacitors requires several undesirable processing steps.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

In a first aspect, there is provided an apparatus, the apparatus comprising
  first and second circuit boards with respective electrodes thereon, the first and second circuit boards in a bonded configuration;
  one or more first layers positioned to be proximal to the one or more of the electrodes;
  electrolyte proximal to the respective electrodes;
  one or more second layers configured to provide for the bonded configuration in which the first and second circuit boards are bonded together, under curing, such that the respective one or more first layers are positioned between the one or more second layers and the electrodes, the bonding defining a chamber therebetween with the electrodes therein and facing one another, the chamber comprising the electrolyte; and
  wherein the one or more first layers are configured to inhibit interaction of the electrolyte with the one or more second layers during curing.

The term "circuit board" may be taken to mean a whole (i.e. complete and functional) circuit board, or part (i.e. one or more constituent layers) of a circuit board. In the latter scenario, bonding of the first and second circuit board parts may form a whole (i.e. complete and functional) circuit board.

The term "curing" may be taken to mean the application of one or more of elevated pressure and elevated temperature for a sufficient period of time to cause bonding of the first and second circuit boards. For example, the apparatus may be cured at a temperature of 150-170° C. and a pressure of 1000 psi for 45 minutes. The apparatus may then be held at room temperature at a pressure of 1000 psi for a further 25 minutes.

The one or more first layers may be co-joined with the one or more second layers to form a single structure.

The one or more first layers and the one or more second layers may be made from the same single piece of material (e.g. cut, stamped or etched out from a single blank of material). In this scenario, the material from which the one or more first layers and the one or more second layers are made may be a bondply or a self-supporting (i.e. rigid or semi-rigid) adhesive. The bondply may comprise a layer of polymer coated on either side by a layer of adhesive. The self-supporting adhesive may be one of the Nikaflex® epoxy-based sheet adhesives by DuPont™, or one of the Pyralux® LG glass-reinforced bonding films by DuPont™.

On the other hand, the one or more first layers and the one or more second layers may be made from different pieces of material which have been co-joined to one another. In this scenario, the material from which the one or more first layers are made may be a coverlay or a polymer, and the material from which the one or more second layers are made may be a bondply or a self-supporting adhesive (as described above). The coverlay may comprise a layer of polymer coated on one side by a layer of adhesive. The different pieces of material may be co-joined to one another using an adhesive such that no substantial additional thickness is added to the single structure by the joining (e.g. the different pieces of material are joined end-to-end rather than one overlapping the other).

The adhesive of the bondply and/or coverlay may be a single component temperature and/or pressure sensitive adhesive. The adhesive of the bondply and/or coverlay may be an acrylic or epoxy based adhesive. The polymer of the bondply and/or coverlay may comprise one or more of polyester, polyethylene terephthalate, and polyimide.

The one or more first layers may be configured to inhibit the interaction of the electrolyte with the one or more second layers during curing by comprising a material which forms a seal to substantially resist the progression of the electrolyte to the one or more second layers when the apparatus is in an assembled but uncured state.

The one or more second layers may comprise a material which is configured to substantially resist the progression of the electrolyte from the chamber following, but not before, curing.

The single structure may comprise one or more inner and one or more outer co-joined concentric rings positioned around the facing electrodes. The one or more inner rings may be formed by the one or more first layers. The one or more outer rings may be formed by the one or more second layers. Each ring may be co-joined to its adjacent ring by one or more joining sections. Radially adjacent joining sections may be located at different circumferential positions of the co-joined concentric rings.

The one or more first layers of the single structure may form first and second inner rings. The one or more second layers of the single structure may form a first outer ring. A joining section which co-joins the first inner ring and the second inner ring may be located diametrically opposite a joining section which co-joins the second inner ring and the first outer ring.

The first and second circuit boards may each comprise a plurality of discrete electrodes thereon. Each discrete electrode of the plurality of discrete electrodes of the first circuit board may be configured to form a discrete electrode pair with a facing discrete electrode of the plurality of discrete electrodes of the second circuit board. The one or more first layers and the electrolyte may be positioned to be proximal to each discrete electrode pair. The one or more co-joined second layers of the single structure may be configured to provide for the bonded configuration in which the first and second circuit boards are bonded together, under curing, such that, for each discrete electrode pair, the one or more first layers are positioned between the one or more second layers and the electrodes of the discrete electrode pair. The bonding may define a plurality of respective discrete chambers therebetween, each with a discrete electrode pair therein and comprising the electrolyte.

The one or more respective discrete chambers may be configured to allow for separation from an adjacent discrete chamber. The one or more respective discrete chambers may comprise cut lines and/or may be sufficiently spaced apart from the adjacent discrete chamber to allow for the separation from the adjacent discrete chamber.

The apparatus may comprise a separator positioned between the electrodes. The electrolyte may be contained within the separator. The electrolyte may be a liquid or gel electrolyte. The electrolyte may be an aqueous or organic electrolyte.

The first and second circuit boards may be 9"×12" flexible printed circuit panels, or larger flexible printed circuit panels.

The apparatus may be a battery, a capacitor, or a battery-capacitor hybrid. The battery may be a primary or secondary battery. The capacitor may be a supercapacitor or an electrolytic capacitor. The apparatus may be one or more of an electronic device, a portable electronic device, a portable telecommunications device, and a module for any of the aforementioned devices.

The respective electrodes may be one or more capacitive elements.

The one or more first layers may be configured to completely inhibit/prevent interaction of the electrolyte with the one or more second layers during curing.

The apparatus may be configured to store electrical charge when a potential difference is applied between the electrodes.

The first layer may be a barrier layer.
The second layer may be a bonding layer.
The first and second circuit boards may be flexible circuit boards.

The first and second circuit boards may be different portions or ends of the same circuit board. For example, a single circuit board can be folded over/around itself to define the respective first and second circuit boards. In another example, the first and second circuit boards can be different layers of the same board.

The one or more of the respective first/barrier layers may comprise coverlay material, or at least material that is electrolyte resistant.

The one or more of the respective second/bonding layers may comprise bondply material.

The apparatus may comprise a separator configured to separate the first and second electrodes, and the separator may comprise electrolyte so as to provide electrolyte within the chamber. The apparatus may comprise a plurality of electrodes/capacitive elements to provide a multilayer capacitive structure.

One or more of the respective first and second circuit boards may comprise a cured first/barrier layer thereon applied and cured prior to curing of the respective one or more second/bonding layers.

The apparatus may be a supercapacitor or a battery.

For example, the apparatus may be configured to store electrical charge at the interface between the electrodes/capacitive elements and the electrolyte. The capacitive elements may be referred to as "electrodes". Each capacitive element may comprise a high surface area material. Each capacitive element may comprise an electrically conductive region having a surface. The electrically conductive region may comprise one or more of the following materials (but is not limited thereto): copper, aluminium, and carbon. The high surface area material may be disposed on the surface of each electrically conductive region. The respective surfaces/high surface area materials of the electrically conductive regions may be configured to face one another.

The electrolyte may be located between the capacitive elements. The electrolyte may comprise first and second ionic species of opposite polarity. The first and second ionic species may be configured to move towards the capacitive element of the first and second circuit boards, respectively, when a potential difference is applied between the capacitive elements. The electrolyte may be an organic electrolyte. The organic electrolyte may be based on a salt such as tetraethylammonium tetrafluoroborate and an aprotic solvent such as acetonitrile, or on a carbonate-based solvent such as propylene carbonate. The electrolyte may comprise tetraethylammonium tetrafluoroborate in acetonitrile. The electrolyte may be an aqueous electrolyte. The electrolyte may be chosen such that a potential difference (e.g. of up to 0.9V, 2.7V or 4V) can be applied between the capacitive elements without the electrolyte undergoing an electrochemical reaction.

The high surface area material of the capacitive elements may be electrically conductive. The high surface area material may comprise one or more of the following: nanoparticles, nanowires, nanotubes, nanohorns, nanofibers and nano-onions. In particular, the high surface area material may comprise one or more of the following: activated carbon, carbon nanowires, carbon nanotubes, carbon nanohorns, carbon nanofibres, graphene, carbon nano-onions or any combination or related structure thereof. The carbon nanotubes may also be multiple wall carbon nanotubes. Oxides and polymers (such as polypyrrole) which exhibit pseudo-capacitance may also be used to form the high surface area material.

The apparatus may comprise a separator between the capacitive elements. The separator may be configured to prevent direct physical contact between the capacitive elements. The separator may comprise one or more pores. The pores in the separator may be configured to allow the first and second ionic species to pass through the separator towards the capacitive elements when the potential difference is applied, thereby facilitating charging of the apparatus. Likewise, the pores in the separator may be configured to allow the first and second ionic species to pass through the separator away from the capacitive elements when the apparatus is used to power an electrical component, thereby facilitating discharging of the apparatus. The separator may comprise one or more of the following: polypropylene, polyethylene, cellulose, and polytetrafluoroethylene. The separator may comprise one, two, three, or more than three layers. Each layer may comprise one or more of the above-mentioned materials.

The first and second circuit boards may be separate circuit boards which have been joined together to define the chamber. The first and second circuit boards may be the same circuit board which has been bent around onto itself to define the chamber. The apparatus may comprise a ring between the first and second circuit boards. The ring may be configured to surround the capacitive elements to form the chamber. The ring may be sealingly attached to the first and second circuit boards, using the second layer, to contain the electrolyte within the chamber. The first and second circuit boards may be sealed together, using the second layer, to contain the electrolyte within the chamber.

The electrically conductive regions of the capacitive elements may be configured to maximise adhesion of the high surface area material to the surfaces of the electrically conductive regions. The electrically conductive regions may be configured to minimise the electrical resistance of the capacitive elements. The thickness of the high surface area material may be configured to minimise the electrical resistance of the capacitive elements.

The apparatus may be configured to be flexible. The first and second circuit boards may be flexible printed circuit boards. Each of the first and second circuit boards may comprise a layer of electrically conductive material coated on either side by a layer of electrically insulating material. The layer of electrically conductive material may be electrically connected to the electrically conductive region. The layer of electrically conductive material may be electrically connected to the electrically conductive region by one or more of the following: a connector, a vertical interconnect access (VIA) connection, a pogo pin, a solder contact, and a wire. The layer of electrically conductive material may comprise copper. The layer of electrically insulating material may comprise polyimide. The layer of electrically insulating material may be adhered to the layer of electrically conductive material by an adhesive.

The apparatus may form part of a multimedia enhancement module. The multimedia enhancement module may be one or more of the following: a camera flash module, a loudspeaker driver module, and a power amplifier module for electromagnetic transmission. The camera flash module may be an LED camera flash module or a xenon camera flash module. The LED camera flash module may comprise one or more of the following: an LED driver, a capacitor charger, and an LED. The loudspeaker driver module may be a stereo audio loudspeaker driver module. The power amplifier module may be a power amplifier module for RF transmission. The apparatus may be used as a power source for a digital display (such as an LED or LCD screen), or as a power source for a storage medium (such as a hard disk drive, random access memory or flash memory). The apparatus may be configured for use in a portable electronic device. The portable electronic device may be a mobile phone.

Each capacitive element may comprise an electrically conductive region having a surface. The method may comprise applying a high surface area material to the surface of each electrically conductive region. The high surface area material may be applied by printing or rolling the high surface area material onto the surface of each electrically conductive region. The method may comprise preparing the high surface area material prior to application by mixing one or more of the following together and subsequently homogenising the mixture: activated carbon, carbon nanotubes, carbon nanohorns, carbon nanofibers and carbon nano-onions. One or more of the activated carbon, carbon nanotubes, carbon nanohorns, carbon nanofibers and carbon nano-onions may be mixed together with a binder and solvent. The mixture may be homogenised by stirring the mixture. The method may comprise annealing the high surface area material after application to evaporate the solvent and consolidate the high surface area material. The method may comprise controlling the thickness of the high surface area material on the surface of each electrically conductive region to minimise the electrical resistance of the capacitive elements. The thickness of the high surface area material may be controlled using a rolling film deposition process or an alternative process such as doctor-blading.

In another aspect, there is provided a method, the method comprising
  providing first and second circuit boards with respective electrodes thereon; providing one or more first layers positioned to be proximal to the one or more of the electrodes;
  providing electrolyte proximal to the respective electrodes;
  bonding the first and second circuit boards together to provide a bonded configuration, under curing, using one or more second layers such that the respective one or more first layers are positioned between the one or more second layers and the electrodes, the bonding defining a chamber therebetween with the electrodes therein and facing one another, the chamber comprising an electrolyte; and wherein the one or more first layers are configured to inhibit interaction of the electrolyte with the one or more second layers during curing.

The one or more first layers may be co-joined with the one or more second layers to form a single structure. The first and second circuit boards may each comprise a plurality of discrete electrodes thereon.

The method may comprise the following prior to bonding of the first and second circuit boards: positioning the first and second circuit boards such that each discrete electrode of the plurality of discrete electrodes of the first circuit board forms a discrete electrode pair with a facing discrete electrode of the plurality of discrete electrodes of the second circuit board with the one or more first layers and the electrolyte positioned to be proximal to each discrete electrode pair, and the one or more co-joined second layers of the single structure positioned to enable the first and second circuit boards to be bonded together, under curing, such that, for each discrete electrode pair, the one or more first layers are positioned between the one or more second layers and the electrodes of the discrete electrode pair, the bonding defining a plurality of respective discrete chambers therebetween, each with a discrete electrode pair therein and comprising the electrolyte.

The provision of the electrolyte proximal to the respective electrodes may be done before or after the provision of one or more first layers positioned to be proximal to the one or more of the electrodes.

The method may provide an apparatus comprising the first and second circuit boards and the electrolyte, the apparatus configured to store electrical charge when a potential difference is applied between the electrodes.

In another aspect, there is provided an apparatus comprising:
first and second circuit boards with respective electrodes thereon;
an electrolyte;
one or more second layers configured to bond the first and second circuit boards together, under curing, so as to define a chamber therebetween with the electrodes therein and facing one another, the chamber comprising the electrolyte; and
one or more first layers positioned within the chamber between the electrolyte and the one or more bonding layers to inhibit interaction of the electrolyte with the one or more bonding layers during curing.

The apparatus may be configured to store electrical charge when a potential difference is applied between the electrodes The present disclosure includes one or more corresponding aspects, embodiments or features in isolation or in various combinations whether or not specifically stated (including claimed) in that combination or in isolation. Corresponding means for performing one or more of the discussed functions are also within the present disclosure.

Corresponding computer programs for implementing one or more of the methods disclosed are also within the present disclosure and encompassed by one or more of the described embodiments. The computer programs may or may not be recorded on a carrier.

The above summary is intended to be merely exemplary and non-limiting.

BRIEF DESCRIPTION OF THE FIGURES

A description is now given, by way of example only, with reference to the accompanying drawings, in which:—

FIGS. 3a-3c show how an FPC supercapacitor is manufactured;

FIGS. 4a-4c show an example according to the present disclosure;

FIGS. 4d-4f show a second example according to the present disclosure;

FIG. 4g shows a third example according to the present disclosure;

FIG. 5 shows a method of the present disclosure;

FIG. 8 shows a fourth example according to the present disclosure;

FIG. 9 shows a fifth example according to the present disclosure; and

DESCRIPTION OF EXAMPLE ASPECTS/EMBODIMENTS

In electrical circuits, batteries and capacitors are used to provide other components with electrical power. These power supplies operate in completely different ways, however. Batteries use electrochemical reactions to generate electricity. They comprise two electrical terminals (electrodes) separated by an electrolyte. At the negative electrode (the anode), an oxidation reaction takes place which produces electrons. These electrons then flow around an external circuit from the anode to the positive electrode (the cathode) causing a reduction reaction to take place at the cathode. The oxidation and reduction reactions may continue until the reactants are completely converted. Importantly though, unless electrons are able to flow from the anode to the cathode via the external circuit, the electrochemical reactions cannot take place. This allows batteries to store electricity for long periods of time.

Figure 1A:
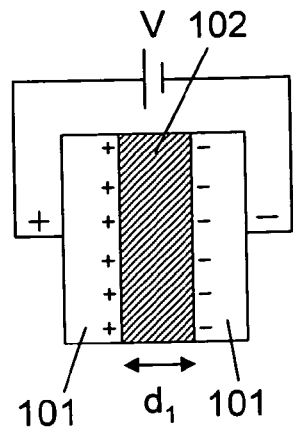
FIGS. 1a-1c illustrate the operation of capacitors and supercapacitors.

In contrast, capacitors store charge electrostatically, and are not capable of generating electricity. A conventional capacitor (FIG. 1a) comprises a pair of electrical plates 101 separated by an electrical insulator 102. When a potential difference is applied between the plates 101, positive and negative electrical charges build up on opposite plates. This produces an electric field across the insulator 102 which stores electrical energy. The amount of energy stored is proportional to the charge on the plates, and inversely proportional to the separation of the plates, $d_1$. Therefore, the energy storage of a conventional capacitor can be increased by increasing the size of the plates 101 or by reducing the thickness of the insulator 102. Device miniaturisation governs the maximum plate size, whilst material properties dictate the minimum insulator thickness that can be used without conduction of the insulator 102 (breakdown).

Figure 1B:
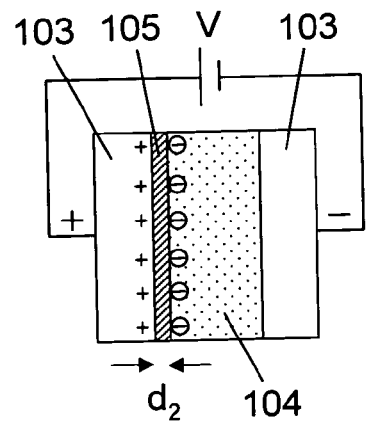

Electrolytic capacitors (FIG. 1b) use a special technique to minimise the plate spacing, $d_2$. They consist of two conductive plates 103 separated by a conducting electrolyte 104. When a potential difference is applied, the electrolyte 104 carries charge between the plates 103 and stimulates a chemical reaction at the surface of one of the plates. This reaction creates a layer of insulating material 105 which prevents the flow of charge. The result is a capacitor with an ultrathin dielectric layer 105 separating a conducting plate 103 from a conducting electrolyte 104. In this configuration, the electrolyte 104 effectively serves as the second plate. Since the insulating layer 105 is only a few molecules thick, electrolytic capacitors are able to store a greater amount of energy than conventional parallel plate capacitors.

Figure 1C:
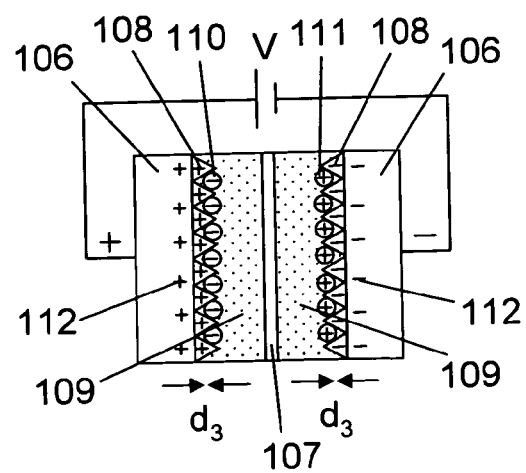

A third type of capacitor, known as a supercapacitor (FIG. 1c), allows even greater energy storage. Supercapacitors (also known as electric double layer capacitors, ultracapacitors, pseudocapacitors and electrochemical double layer capacitors) have similarities to both electrolytic and conventional capacitors. Like a conventional capacitor, a supercapacitor has two electrically conducting plates 106 that are separated by a dielectric material (a separator) 107. The plates 106 are coated in a porous material 108 such as powdered carbon to increase the surface area of the plates 106 for greater charge storage. Like an electrolytic capacitor (and also a battery), a supercapacitor contains an electrolyte 109 between the conducting plates 106. When a potential difference is applied between the plates, the electrolyte 109 becomes polarised. The potential on the positive plate attracts the negative 110 ions in the electrolyte 109, and the potential on the negative plate attracts the positive ions 111. The dielectric separator 107 is used to prevent direct physical contact (and therefore electrical contact) between the plates 106. The separator 107 is made from a porous material to allow the ions 110, 111 to flow towards the respective plates 106.

Unlike batteries, the applied potential is kept below the breakdown voltage of the electrolyte 109 to prevent electrochemical reactions from taking place at the surface of the plates 106. For this reason, a supercapacitor cannot generate electricity like an electrochemical cell. Also, without electrochemical reactions taking place, no electrons are generated. As a result, no significant current can flow between the electrolyte 109 and the plates 106. Instead, the ions 110, 111 in solution arrange themselves at the surfaces of the plates 106 to mirror the surface charge 112 and form an insulating "electric double layer". In an electrical double layer (i.e. a layer of surface charge 112 and a layer of ions 110, 111), the separation, $d_3$, of the surface charges 112 and ions 110, 111 is on the order of nanometers. The formation of the electric double layer and the use of a high surface area material 108 on the surface of the plates 106 allow a huge number of charge carriers to be stored at the plate-electrolyte interface.

Supercapacitors have several advantages over the construction of traditional batteries, and as a result, have been tipped to replace batteries in many applications. Supercapacitors function by supplying large bursts of current to power a device and then quickly recharging themselves. Their low internal resistance, or equivalent series resistance (ESR), permits them to deliver and absorb these large currents, whereas the higher internal resistance of a traditional chemical battery may cause the battery voltage to collapse. Also, whilst a battery generally demands a long recharging period, supercapacitors can recharge very quickly, usually within a matter of minutes. They also retain their ability to hold a charge much longer than batteries, even after multiple recharging instances. When combined with a battery, a supercapacitor can remove the instantaneous energy demands that would normally be placed on the battery, thereby lengthening the battery lifetime.

Whereas batteries often require maintenance and can only function well within a small temperature range, supercapacitors are maintenance-free and perform well over a broad temperature range. Supercapacitors also have longer lives than batteries, and are built to last until at least the lifetime of the electronic devices they are used to power. Batteries, on the other hand, typically need to be replaced several times during the lifetime of a device.

Supercapacitors are not without their drawbacks, however. Despite being able to store a greater amount of energy than conventional and electrolytic capacitors, the energy stored by a supercapacitor per unit weight is considerably lower than that of an electrochemical battery. In addition, the working voltage of a supercapacitor is limited by the electrolyte breakdown voltage, which is not as issue with batteries.

As mentioned earlier, existing supercapacitors are bulky, suffer from electrolyte swelling and do not have the optimum form factor for attachment to the circuit boards of portable electronic devices. Furthermore, the attachment of existing supercapacitors to circuit boards requires several processing steps, thereby rendering them impractical.

It is possible to manufacture flexible supercapacitors using materials and processes normally used in making flexible printed circuit boards (FPCs). Such FPCs are used to connect electronic displays (like in portable electronic devices) to their central control board. Some difficulties discussed above can be alleviated using capacitors produced via such FPC technology as they can be provided as part of the FPC circuit rather than provided separately as part of the control board.

Figure 2A:
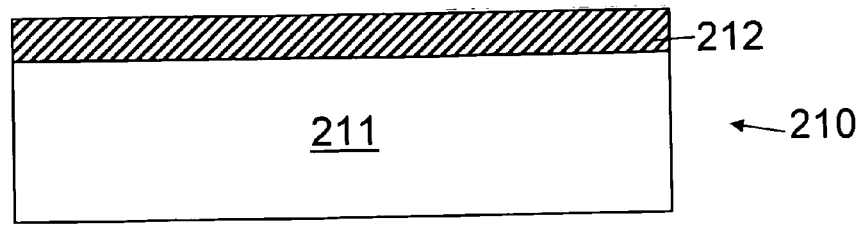
FIGS. 2a-2c show materials used in flexible printed circuit boards (FPCs)
Figure 2B:
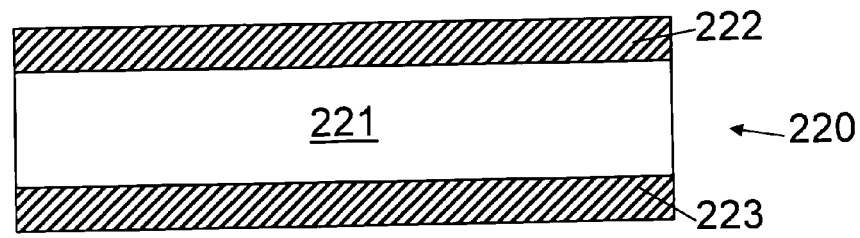
Figure 2C:
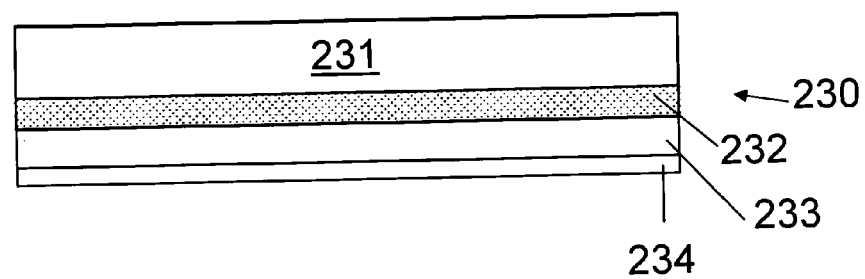

FIGS. 2a-2c show materials used by flexible printed circuit board manufacturers. FIG. 2a illustrates a material that comprises a polyimide substrate 211 with a top side and a bottom side, and also comprises an adhesive material 212 provided on one of those sides. This type of material is called 'coverlay' 210 in the FPC manufacturing industry and is a well-understood term and material type.

FIG. 2b shows a similar material. A polyimide substrate 221 has a top side and a bottom side, and also comprises an adhesive layer of material 222 provided on one of the sides, and adhesive layer of material 223 provided on the other side. This is known as 'bondply' 220, and is similar to the 'coverlay' of FIG. 2a except that the other side of the polyimide substrate is also provided with a layer of adhesive.

FIG. 2c shows another material called 'base layer' material 230 (also known as copper clad/cladding). This comprises a polyimide substrate 231, on which is provided an adhesive layer of material 232. On this layer of adhesive is provided a copper layer 233 and, further, an active material 234. It should be noted that this active material is not typically part of the standard FPC material, but can be added as part of the construction process. These form the basis of at least one side of a capacitor. Tracks can also be provided on the other side of the base layer 230, and the copper and active material layers 233, 234 can be etched in a particular way to define active areas for a capacitor of a particular shape or configuration.

It should be noted that other materials instead of polyimide can also be useable for different FPC applications, such as polyester, and that various adhesive types can be used. In addition, the copper layer 233 in the base layer could also be another type of conductive material (e.g. aluminium, carbon, etc).

Figure 3A:
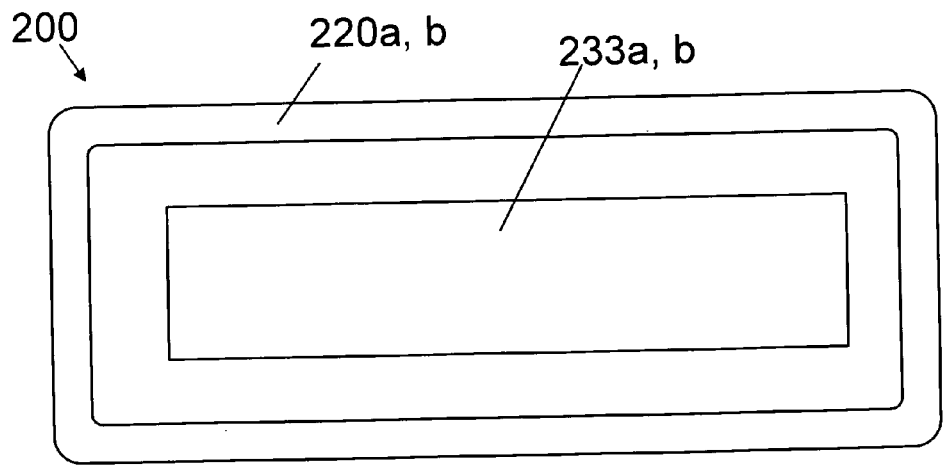

FIGS. 3a-3c show an example supercapacitor formed using FPC manufacturing methods and the materials discussed in FIGS. 2a-2c.

FIG. 3a illustrates how a supercapacitor apparatus 200 is formed and is illustrated from a top-down view of the apparatus 200. The overall supercapacitor 200 needs to have top and bottom capacitive elements (can be understood to be "electrodes") with an electrolytic material (like a dielectric in a normal capacitor, which can be provided as a separator having electrolytic fluid soaked into it or stored therein) placed between. The top and bottom capacitive elements are, in this example, provided by the copper layer 233 (together with the active material layer 234) of the base layer material 230 which provides the top capacitive element 233a and bottom capacitive element 233b. Other materials are also within the scope of the present disclosure, but for the sake of clarity we will describe this example with reference to the various layers of the respective materials described in FIGS. 2a-2c.

The capacitive elements 233a, b will define the central area of the supercapacitor and are configured to allow for opposing charges to be stored on each capacitive element, thereby providing for the capacitive effect needed. A separator (not shown in FIG. 3a) is provided between the capacitive elements 233a, b that contains electrolytic fluid. To seal the supercapacitor structure together, the bondply material 220 is provided as an adhesive layer between the top and bottom portions of the apparatus 200 and cured during a final assembly step. This assembly allows a completely packaged supercapacitor formed by FPC processes, and therefore allows integral formation of the capacitor as part of an FPC in a device or the like.

FIG. 3b shows an initial assembly stage of this supercapacitor 200 from a side-on view in more detail.

A symmetry line has been drawn across the diagram to denote that the top portion of the diagram is (in this example) symmetrical with the bottom portion and therefore an identical mirror image of the bottom portion.

The top portion contains capacitive element 233a which, in this example, is provided by an etched arrangement of base layer material 230. The etching of the top portion leaves a defined active capacitive element area in the centre of the apparatus and also provides an 'overhang' of polyimide and adhesive layers 231a, 232a, 231b, 232b that extends outwards to provide lateral extremes to the apparatus 200.

Figure 10:
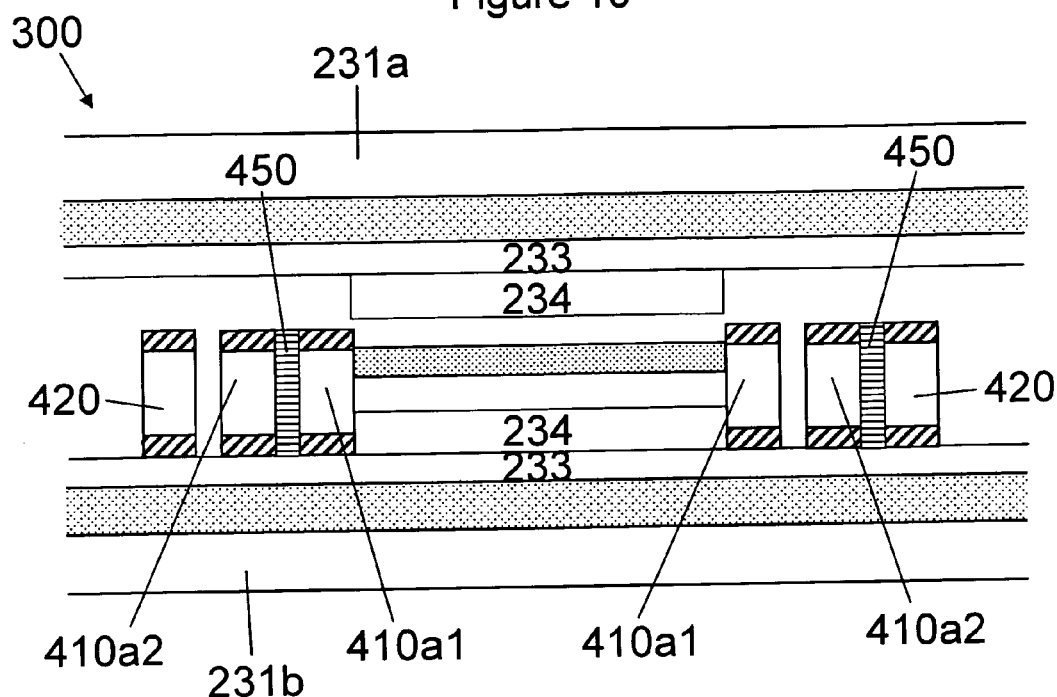
FIG. 10 shows a sixth example according to the present disclosure.

In another example (shown in FIG. 8), the copper layer 233 is not etched. Instead, the copper forms a continuous layer which covers the area of the device, and the active material 234 is positioned in the centre of the copper layer 233. This configuration is advantageous because the continuous copper layer 233 (which is a better moisture barrier than the polyimide substrate 231a, 231b) helps to prevent water/moisture from the surrounding environment from reaching and degrading the active material 234. As shown in FIGS. 9 and 10, the same concept may be applied to other embodiments described herein.

The capacitive elements 233a, b are provided by the copper material together with the active material of the base layer 230 which face inwards towards the centre symmetry line. These act as the capacitive 'plates' of the supercapacitor 200. This also means that the exterior of the supercapacitor 200 is provided by the polyimide 231a of the base layer material 230. The adhesive layer 232a is already cured and set to bond the polyimide layer 231a to the copper and active material 233a, 234a. The same features can also be seen on the mirror image capacitive element 233b on the bottom portion.

Between the capacitive elements 233a, 233b is provided a separator 240. This can be likened to a thin leaf of tissue paper which is able to store a volume of electrolyte/electrolytic fluid 245, much like a thin sponge. This fluid is important for the purpose of ensuring correct operation of the capacitor. The separator 240 is proximal to the capacitive elements 233a, 233b to ensure that the capacitive elements 233a, 233b are kept electrically separate so that they do not short each other.

In this example the separator is larger in area than the capacitive elements 233a, 233b so that there can be a greater tolerance to the positioning the capacitive elements 233a, 233b during assembly while still avoiding shorting of the capacitive elements 233a, 233b. For example, if the separator 240 is of the same area as the capacitive elements then there is very little room for error in positioning the separator between the capacitive elements 233a, 233b, as all three components (233a, 240, 233b) would have to line up perfectly to ensure that there was no chance of an electrical short between the capacitive elements 233a, 233b across the separator 240.

At the outermost lateral extremes of the side-on view, positioned away from the capacitive elements 233a, 233b, is the bondply material 220 which acts as an adhesive layer 220a, 220b to seal the whole supercapacitor apparatus 200 together. During assembly, the adhesive layers (220a, 220b) are not cured or set, but are provided prior to a final assembly step in which heat and pressure is applied to cure those adhesive layers.

In this example, the adhesive layers 220a/220b are provided on both the top and bottom circuit boards 230a, 230b so that when finally assembled, adhesive layer 220a meets adhesive layer 220b for final curing. However, in other examples, a single layer 220a could be provided on one of the two sides to be joined together. Other variations are also within the scope of the present disclosure, for example, continuous and non-continuous beads of adhesive.

The adhesive layers 220a, 220b and the circuit boards 230a, 230b define a chamber therebetween in which the capacitive elements 233a, 233b and the electrolyte 245 are contained. This allows for the apparatus 200 to store charge and operate as a supercapacitor as intended.

FIG. 3c illustrates this final assembly step. The top and bottom sides of the apparatus 200 are compressed together under an appropriate amount of force and an appropriate amount of heat is applied to cause any uncured adhesive to set and thereby integrate the whole capacitor arrangement together. The exact pressure and temperature will be dependent on the adhesive material in question and would be well understood in the art to those who manufacture FPC devices.

However, a difficulty with this method of manufacture is that, upon pressure being applied to the apparatus 200, the capacitive elements 233 come together and close the gap therebetween which in turns forces electrolytic fluid 245 (stored in the separator 240) towards the adhesive layers at the lateral extremities of the apparatus 200. The problem with this is that electrolyte 245 is a solvent which can prohibit adequate curing of the adhesive material in the adhesive layers 220a/220b. In turn, this means that it can be particularly troublesome to successfully complete assembly of a securely integrated capacitor via this method as the adhesive may not cure correctly or sufficiently.

Other examples depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

Figure 4A:
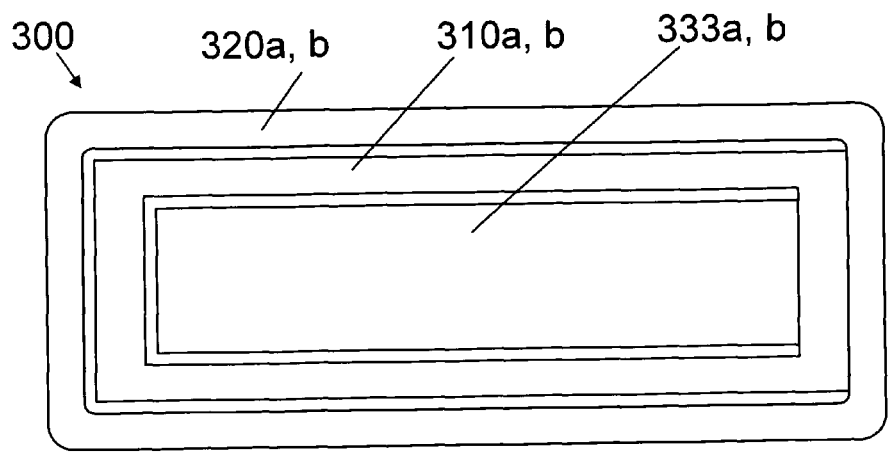
Figure 4B:
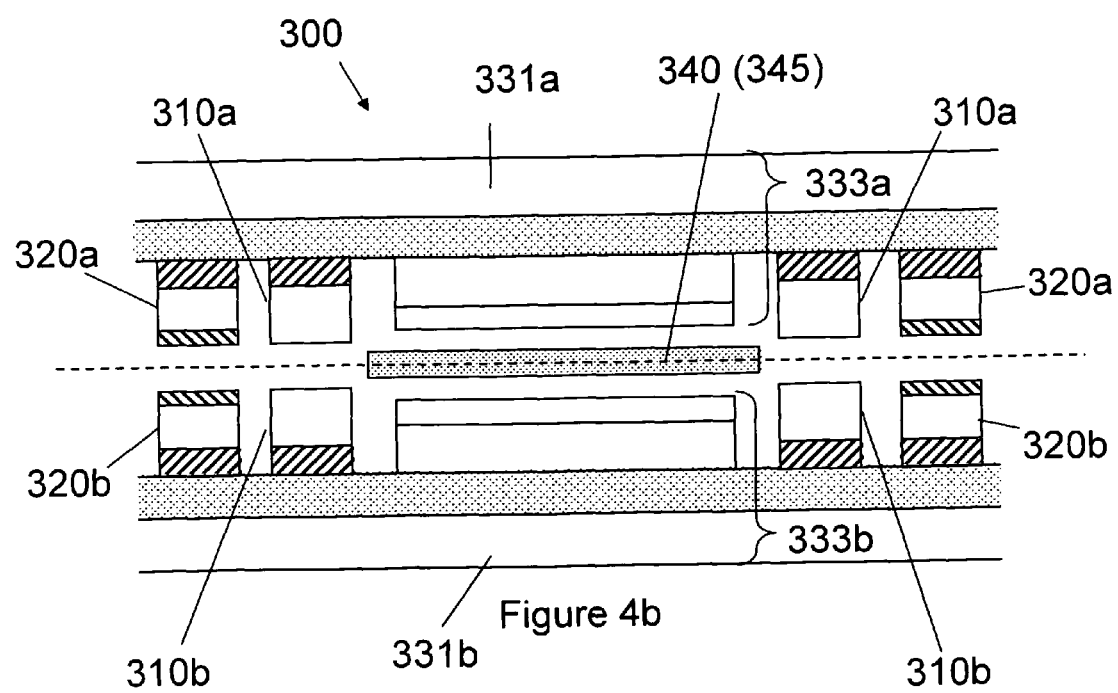

FIGS. 4a-4c illustrate an example according to the present disclosure that attempts to address this issue.

FIG. 4a illustrates a supercapacitor apparatus 300 that is similar to the apparatus 200 of FIG. 3a, except that another layer is provided that helps to inhibit the interaction of the electrolyte 345 with the respective adhesive layers during curing. This layer is a barrier layer 310a/b which, in this example, is provided by coverlay material 310 and is provided on the top and bottom portions of the apparatus 300 to provide top and bottom barrier layers 310a and 310b.

FIG. 4b shows how these barrier layers are positioned between the central capacitive elements 333a, 333b and the laterally positioned adhesive layers 320a, 320b. These can be pre-cured to the respective central adhesive layer 332a/332b of the capacitive element/exterior structure (in this example provided by base layer material 330). The adhesive layers 320a, 320b are provided (in this example) by bondply material that has a polyimide inner layer and adhesive outer layers (as shown in FIG. 2b), but in other examples the adhesive layer may literally just be composed of adhesive material (i.e. no polyimide). Other material types are also within the scope of the present disclosure.

This figure shows a gap between the capacitive elements 333a, 333b and the respective barrier layers 310a, 310b. In some embodiments, however, the barrier layers 310a, 310b may be flush with the capacitive elements 333a, 333b such that there is no gap therebetween (as shown in FIG. 9). This configuration may help to inhibit interaction of the electrolyte 345 with the copper layers 233, which could otherwise cause degradation of the copper. The same concept may be applied to other embodiments described herein (as shown in FIG. 10).

FIG. 4c shows what these barrier layers 310a, 310b accomplish. When the pressure is applied, and the electrolyte 345 is forced towards the lateral extremities of the apparatus 300, the barrier layers 310a, 310b come together. Like the adhesive layers 220a/220b shown in FIGS. 3a-3c, these barrier layers 310a/310b extend towards the interior of the apparatus 300 and meet each other during this final assembly step. Also, like certain embodiments of the adhesive layers 220a/220b shown in FIGS. 3a-3c, the barrier layers 310a/310b can be provided as a single barrier layer 310a that extends on one circuit board 330a/b. The barrier layers 310a/310b therefore provide and form a seal or gasket between the separator 340 which contains the electrolyte/electrolytic fluid 345 to prevent the electrolyte 345 from reaching the adhesive layers 320a/b at the furthest extremities of the apparatus 300. This means that the interaction between the electrolyte and the adhesive layers is inhibited and therefore allows the adhesive to cure and set correctly. It should be noted that the apparatus can be configured in some ways so as to be useable as a supercapacitor, or configured in other ways to be useable as a battery, or in some ways to be useable as a battery and/or a supercapacitor.

A plurality of FPCs can be produced simultaneously using panelised production. This technique involves forming an array of each component in respective layers (e.g. 9"×12" FPC panels); stacking the constituent layers one on top of another; aligning the layers with one another such that each component is correctly positioned with respect to the other components of the FPC; and heating/pressing the layered stack to cause curing of the adhesive. The resulting structure therefore comprises an array of FPCs which are formed together as a single multi-layered panel. The single panel can then by divided up to produce a plurality of individual FPCs.

Forming the apparatus 300 shown in FIGS. 4a-4c using panelised production may, however, be laborious and time-consuming. This is because the one or more first layers 310a, 310b (which act as barrier layers) and the one or more second layers 320a, 320b (which act as bonding layers) would need to be placed, individually, in their respective positions within the FPC array. This inefficiency may be addressed by co-joining the one or more first layers 310a, 310b with the one or more adjacent second layers 320a, 320b to form a single structure. In this way, the one or more first layers 310a, 310b and the one or more second layers 320a, 320b can be correctly and easily positioned together within the FPC array in a single step.

The one or more first layers 310a, 310b and the one or more second layers 320a, 320b may be made from the same single piece of material, or may be made from different pieces of material which have been co-joined to one another.

In the first scenario, the one or more first layers 310a, 310b and the one or more second layers 320a, 320b could be formed by removing portions (e.g. using a cutting, stamping or etching process) from a single panel/sheet. Since the single piece of material would be used to form both the one or more first layers 310a, 310b and the one or more second layers 320a, 320b, it should be able to provide the functionality of both components (i.e. it should be suitable for use as a bonding material and as a gasket material). In this respect, the single panel/sheet may be a self-supporting adhesive per se, or may be a bondply comprising adhesive.

In the second scenario, the one or more first layers 310a, 310b and the one or more second layers 320a, 320b could be formed by fabricating the one or more first layers 310a, 310b from a first piece of material; fabricating the one or more second layers 320a, 320b from a second piece of material; and then attaching the first piece of material to the second piece of material (e.g. using adhesive, pins, or any other type of connector used in FPC processing). Advantageously, the first and second pieces of material may be co-joined to one another in such a way that no substantial additional thickness is added to the single structure by the joining (e.g. the different pieces of material are joined end-to-end rather than one overlapping the other). The single co-joined structure could then be positioned as a single unit within the FPC array. Since different pieces of material would be used to form the one or more first layers 310a, 310b and the one or more second layers 320a, 320b, the material used to form the one or more first 310a, 310b layers could be different from the material used to form the one or more second layers 320a, 320b. For example, the material from which the one or more first layers 310a, 310b are made may be a coverlay or a polymer, and the material from which the one or more second layers 320a, 320b are made may be a bondply or an adhesive.

The one or more first layers 310a, 310b and the one or more second layers 320a, 320b may be formed as one or more inner and one or more outer co-joined concentric rings (respectively) positioned around the facing electrodes of the apparatus 300. The outer rings are configured to enable bonding of the first 230a and second 230b circuit boards, and the inner rings are configured to inhibit interaction of the electrolyte with the outer rings during curing.

One example of such a structure is shown in plan view in FIG. 4d. In this example, the single co-joined structure 350 comprises two inner rings 410a1, 410a2 (i.e. two first, layers 310a, 310b) and one outer ring 420 (i.e. one second layer 320a, 320b). The first inner ring 410a1 is co-joined to the second inner ring 410a2 by a first joining section 450, and the second inner ring 410a2 is co-joined to the outer ring 420 by a second joining section 460. The areas labelled 472 are voids in the structure, the centre-most of which provides the space for the electrodes 333a, 333b and electrolyte 345 of the apparatus 300. As can be seen in this figure, the first joining section 450 is located diametrically opposite the second joining section 460. This configuration is beneficial, as the joining sections 450, 460 can be weak points in the seal used to resist progression of the electrolyte 345 to the one or more second layers 320a, 320b when the apparatus 300 is in an assembled but uncured state. Maximising the distance between the weak points of the structure can therefore provide a more effective seal. Nevertheless, the first 450 and second 460 joining sections could be positioned in other locations on the circumference between the adjacent rings.

In the example shown in FIG. 4d, there is only one joining section 450 between the first inner ring 410a1 and the second inner ring 410a2, and only one joining section 460 between the second inner ring 410a2 and the outer ring 420. It will be appreciated, however, that the adjacent rings of the single structure 350 could be co-joined using a plurality of joining sections rather than just a single joining section (e.g. the first inner ring 410a1 may be co-joined to the second inner ring 410a2 by two or more joining sections). This configuration may provide additional structural rigidity during fabrication and positioning of the single structure 350. For example, the first inner ring 410a1 may be co-joined to the second inner ring 410a2 by joining sections 491 located at each side of the rings. In addition, the second inner ring 410a2 may be co-joined to the outer ring 420 by joining sections 492 located at each corner of the rings. As well as improving the structural rigidity of the single structure 350, this configuration provides effective sealing due to the spatial separation of each of the different joining sections 491, 492.

Furthermore, the single structure 350 is not limited to the above-mentioned number of rings. At the most basic level, the single structure 350 may comprise one inner ring 410a1 (first layer 310a, 310b) and one outer ring 420 (second layer 320a, 320b). However, the single structure 350 could comprise any number of inner 410a1, 410a2 (first layers 310a, 310b) and outer 420 (second layers 320a, 320b) rings provided that theadjacent rings are co-joined to one another. In general, the greater the number of inner rings 410a1, 410a2, the less chance there is of interaction between the electrolyte 345 and the outer rings 420. Also, the greater the number of outer rings 420, the less chance there is of any interaction between the electrolyte 345 and the outer rings 420 from completely preventing bonding of the first 230a and second 230b circuit boards. To facilitate sealing, however, the radially adjacent joining sections 450, 460 should be located at different circumferential positions of the co-joined concentric rings.

Also, the single structure is not limited to the square configuration shown in FIG. 4d. In practice, each ring may have any shape (e.g. square, rectangular, circular, elliptical, pentagonal, hexagonal, octagonal, etc) provided that it forms a loop to effect the required functionality. For example, it is important that the inner rings form (e.g. complete) loops to prevent interaction of the electrolyte with the outer loops, and it is important that the outer rings form (e.g. complete) loops to provide a completely sealed chamber.

Figure 4E:
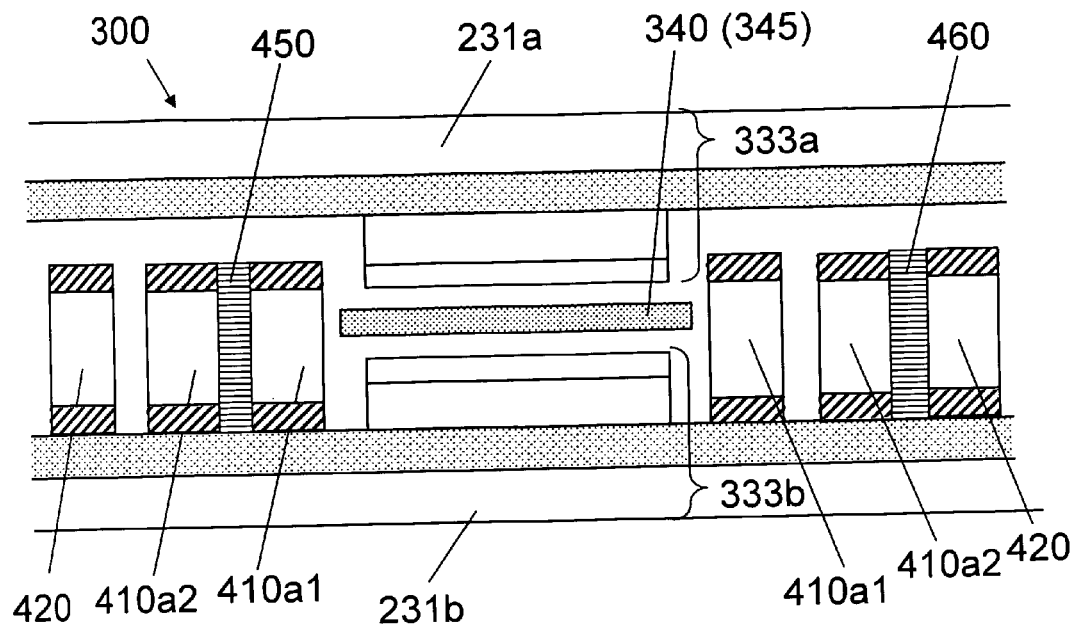
Figure 4F:
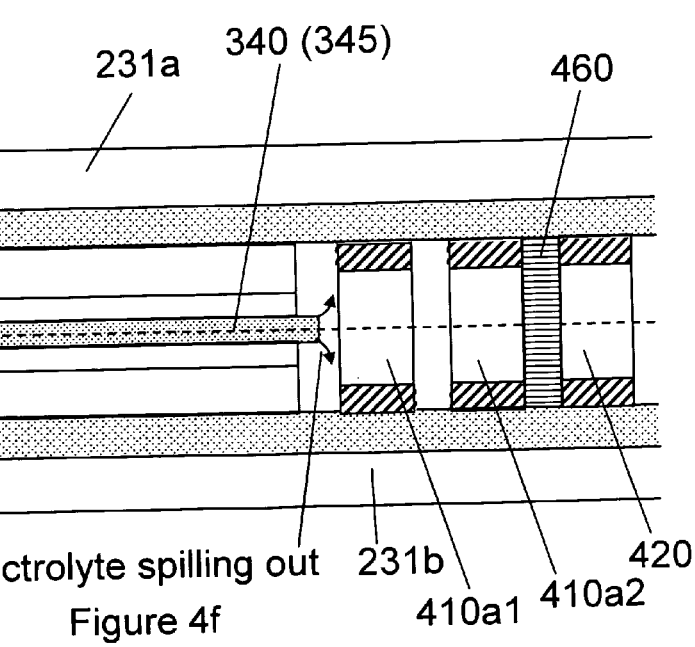

FIGS. 4e and 4f show cross-sectional views of the FPC-integrated apparatus 300 described herein comprising the single structure 350 of FIG. 4d before and after the curing process, respectively. In these figures, the inner 410a1, 410a2 and outer 420 rings are provided only on the bottom circuit board. However, in another example, the inner 410a1, 410a2 and outer 420 rings may be provided on both the top and bottom circuit boards such that, when the apparatus is assembled for curing, the upper inner rings meet the lower inner rings, and the upper outer rings meet the lower outer rings. This configuration is similar to that shown in FIGS. 4b and 4c. Another option is that the inner 410a1, 410a2 and outer 420 rings are provided only on the top circuit board.

As mentioned above, co-joining the one or more first layers 310a, 310b with the one or more second layers 320a, 320b to form a single structure 350 allows a plurality of FPC-integrated apparatuses 300 to be fabricated efficiently using panelised production (FIG. 4g). In practice, this would involve forming an FPC panel/sheet 490 comprising a single co-joined structure 350 for each of the different apparatuses 300; and positioning said panel 490 within the multi-layered FPC stack. The multi-layered FPC stack would then be cured to define a plurality of discrete apparatuses 300, each having a respective chamber comprising an electrode pair 333a, 333b and electrolyte 345.

FIG. 4g shows one example of an FPC panel/sheet 490 suitable for providing six single co-joined structures 350 for six individual/discrete apparatuses 300. In this example, the outer ring 420 (i.e. the second layer 320a, 320b used for bonding the first 230a and second 230b circuit boards) of each apparatus 300 is co-joined to the outer ring 420 of adjacent apparatuses 300. This may be achieved by forming the outer rings 420 (and possibly also the inner rings 410a1, 410a2) of each apparatus 300 from the same single piece of material. Dotted lines 486 (which could be lines of weakness, e.g. perforations) indicate where the FPC panel/sheet 490 would be cut following completion of the panelised production process. Although this example shows an FPC panel/sheet 490 suitable for providing single co-joined structures 350 for six apparatuses 300, it will be appreciated that this could be scaled to provide single-co-joined structures 350 for any number of apparatuses 300.

In summary, the example above provides an improved method of assembling a supercapacitor apparatus as per that of FIGS. 3a-3c and FIGS. 4a-4g.

This method is shown in FIG. 5 and comprises:
401—providing first and second circuit boards with respective capacitive elements thereon;
402—providing one or more first layers positioned to be proximal to the one or more of the capacitive elements and configured/positioned to inhibit the interaction of the electrolyte with the one or more second layers during curing;
403—providing electrolyte (with or without a separator) proximal to the respective capacitive elements; and
404—bonding the first and second circuit boards together to provide a bonded configuration, under curing, using one or more second layers such that the respective one or more first layers are positioned between the one or more second layers and the capacitive elements, the bonding defining a chamber therebetween with the capacitive elements therein and facing one another, (the chamber comprising the aforementioned electrolyte).

To facilitate panelised production, the first and second circuit boards may each comprise a plurality of discrete electrodes thereon, and the one or more first layers may be co-joined with the one or more second layers to form a single structure. In this scenario, the method may comprise positioning the first and second circuit boards such that each discrete electrode of the plurality of discrete electrodes of the first circuit board forms a discrete electrode pair with a facing discrete electrode of the plurality of discrete electrodes of the second circuit board with the one or more first layers and the electrolyte positioned to be proximal to each discrete electrode pair, and the one or more co-joined second layers of the single structure positioned to enable the first and second circuit boards to be bonded together, under curing, such that, for each discrete electrode pair, the one or more first layers are positioned between the one or more second layers and the electrodes of the discrete electrode pair, the bonding defining a plurality of respective discrete chambers therebetween, each with a discrete electrode pair therein and comprising the electrolyte.

Figure 6:
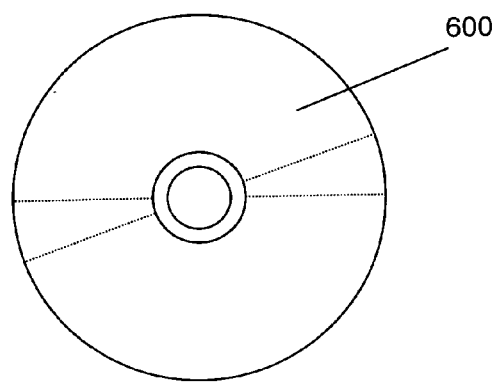
FIG. 6 shows a recording medium for a computer program.

The method may be performed under the control of a computer program, which may be recorded on a medium (e.g. FIG. 6). It should also be noted that stacking of layers can be provided so as to provide repeated layers within the chamber defined by the first and second circuit boards, or multiple apparatus can be provided between respective adjacent circuit boards. This can provide a multilayer structure or construction to provide multiple supercapacitor and/or battery apparatus within the same structure. For example, multiple supercapacitors could be formed and serially linked in this way to provide an apparatus with a higher voltage output.

Figure 7:
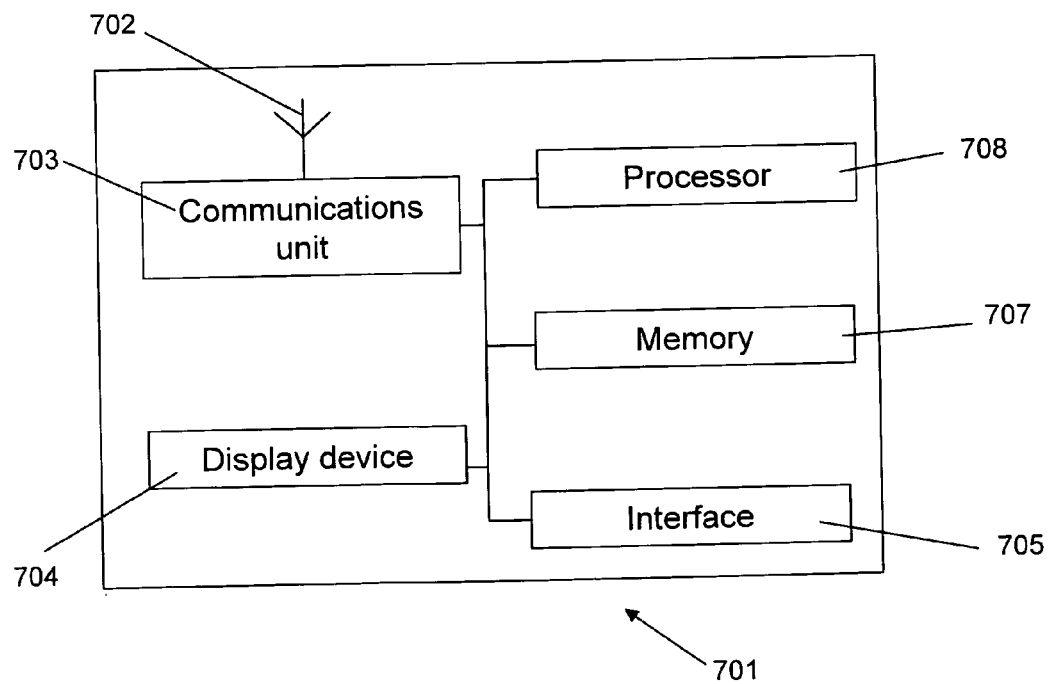
FIG. 7 shows another example embodiment of an apparatus comprising a supercapacitor/battery apparatus.

The aforementioned supercapacitor/battery apparatus could be used as a component for another apparatus e.g. a PDA. For example, FIG. 7 depicts an apparatus (701) of an example embodiment, such as a mobile phone. In other example embodiments, the apparatus (701) may comprise a module for a mobile phone (or PDA or audio/video player), and may just comprise a suitably configured memory (707) and processor (708). The supercapacitor/battery apparatus may provide power for the memory/processor/portable electronic device apparatus.

The example embodiment of FIG. 7, in this case, comprises a display device (704) such as, for example, a Liquid Crystal Display (LCD) or touch-screen user interface. The apparatus (701) of FIG. 7 is configured such that it may receive, include, and/or otherwise access data. For example, this example embodiment (701) comprises a communications unit (703), such as a receiver, transmitter, and/or transceiver, in communication with an antenna (702) for connecting to a wireless network and/or a port (not shown) for accepting a physical connection to a network, such that data may be received via one or more types of networks. This example embodiment comprises a memory (707) that stores data, possibly after being received via antenna (702) or port or after being generated at the user interface (705). The processor (708) may receive data from the user interface (705), from the memory (707), or from the communication unit (703). It will be appreciated that, in certain example embodiments, the display device (704) may incorporate the user interface (705). Regardless of the origin of the data, these data may be outputted to a user of apparatus (701) via the display device (704), and/or any other output devices provided with apparatus. The processor (108) may also store the data for later user in the memory (707). The memory (707) may store computer program code and/or applications which may be used to instruct/enable the processor (708) to perform functions (e.g. read, write, delete, edit or process data).

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that the any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising:
    first and second circuit boards with respective electrodes thereon, the first and second circuit boards in a bonded configuration;
    one or more first layers positioned to be proximal to the one or more of the electrodes;
    electrolyte proximal to the respective electrodes;
    one or more second layers configured to provide for the bonded configuration in which the first and second circuit boards are bonded together, under curing, such that the respective one or more first layers are positioned between the one or more second layers and the electrodes, the bonding of the first and second circuit boards with the electrodes and the one or more second layers defining a chamber therebetween with the electrodes therein and facing one another, the chamber comprising the electrolyte; and
    wherein the one or more first layers are configured to inhibit interaction of the electrolyte with the one or more second layers during curing.

2. The apparatus of claim 1, wherein the one or more first layers are co-joined with the one or more second layers to form a single structure.

3. The apparatus of claim 2, wherein the one or more first layers and the one or more second layers are made from different pieces of material which have been co-joined to one another.

4. The apparatus of claim 1, wherein the one or more first layers are configured to inhibit the interaction of the electrolyte with the one or more second layers during curing by comprising a material which forms a seal to substantially resist the progression of the electrolyte to the one or more second layers when the apparatus is in an assembled but uncured state.

5. The apparatus of claim 1, wherein the one or more second layers comprise a material which is configured to substantially resist the progression of the electrolyte from the chamber following, but not before, curing.

6. The apparatus of claim 3, wherein the material from which the one or more first layers are made is a coverlay or a polymer, and the material from which the one or more second layers are made is a bondply or an adhesive.

7. The apparatus of claim 6, wherein the coverlay comprises a layer of polymer coated on one side by a layer of adhesive.

8. The apparatus of claim 2, wherein the single structure comprises one or more inner and one or more outer co-joined concentric rings positioned around the facing electrodes, the one or more inner rings formed by the one or more first layers and the one or more outer rings formed by the one or more second layers.

9. The apparatus of claim 8, wherein each ring is co-joined to its adjacent ring by one or more joining sections, and wherein radially adjacent joining sections are located at different circumferential positions of the co-joined concentric rings.

10. The apparatus of claim 2, wherein the one or more first layers of the single structure form first and second inner rings and the one or more second layers of the single structure form a first outer ring, and wherein a joining section which co-joins the first inner ring and the second inner ring is located diametrically opposite a joining section which co-joins the second inner ring and the first outer ring.

11. The apparatus of claim 2, wherein:
    the first and second circuit boards each comprise a plurality of discrete electrodes thereon, each discrete electrode of the plurality of discrete electrodes of the first circuit board configured to form a discrete electrode pair with a facing discrete electrode of the plurality of discrete electrodes of the second circuit board;
    the one or more first layers and the electrolyte are positioned to be proximal to each discrete electrode pair;
    the one or more co-joined second layers of the single structure are configured to provide for the bonded configuration in which the first and second circuit boards are bonded together, under curing, such that, for each discrete electrode pair, the one or more first layers are positioned between the one or more second layers and the electrodes of the discrete electrode pair, the bonding defining a plurality of respective discrete chambers therebetween, each with a discrete electrode pair therein and comprising the electrolyte.

12. The apparatus of claim 11, wherein the one or more respective discrete chambers are configured to allow for separation from an adjacent discrete chamber.

13. The apparatus of claim 1, wherein the apparatus is a battery, a capacitor, or a battery-capacitor hybrid.

14. The apparatus of claim 1, wherein the apparatus is one or more of an electronic device, a portable electronic device, a portable telecommunications device, and a module for any of the aforementioned devices.

* * * * *